US012212298B2

(12) United States Patent
Mansoorzare et al.

(10) Patent No.: US 12,212,298 B2
(45) Date of Patent: Jan. 28, 2025

(54) MICRO-MECHANICAL RESONATOR HAVING OUT-OF-PHASE AND OUT-OF-PLANE FLEXURAL MODE RESONATOR PORTIONS

(71) Applicant: TEXAS INSTRUMENTS INCORPORATED, Dallas, TX (US)

(72) Inventors: Hakhamanesh Mansoorzare, Orlando, FL (US); Ting-Ta Yen, San Jose, CA (US); Jeronimo Segovia-Fernandez, San Jose, CA (US); Bichoy Bahr, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/877,206

(22) Filed: Jul. 29, 2022

(65) Prior Publication Data

US 2024/0039500 A1 Feb. 1, 2024

(51) Int. Cl.
*H03H 3/007* (2006.01)
*H03H 9/02* (2006.01)
*H03H 9/10* (2006.01)

(52) U.S. Cl.
CPC ........ *H03H 3/0076* (2013.01); *H03H 9/1057* (2013.01); *H03H 2009/02283* (2013.01)

(58) Field of Classification Search
CPC .. H03H 3/0076; H03H 9/1057; H03H 9/2489; H03H 9/2494; H03H 2009/00283
See application file for complete search history.

(56) References Cited

U.S. PATENT DOCUMENTS

| 9,366,535 B2* | 6/2016 | Shimura | G01C 19/5607 |
| 2015/0316377 A1* | 11/2015 | Gerson | G01C 19/5642 |
| | | | 73/504.15 |
| 2016/0197597 A1* | 7/2016 | Yamada | H03H 9/171 |
| | | | 29/25.35 |

* cited by examiner

*Primary Examiner* — Jeffrey M Shin
(74) *Attorney, Agent, or Firm* — Frank D. Cimino

(57) ABSTRACT

A micro-mechanical resonator die includes: micro-mechanical resonator die layers; a cavity formed in at least one of the micro-mechanical resonator die layers; and a micro-mechanical resonator suspended in the cavity. The micro-mechanical resonator includes: a base; a first resonator portion extending from the base along a first plane; and a second resonator portion extending from the base along a second plane. The first resonator portion is configured to operate in an out-of-plane flexural mode that displaces at least part of the first resonator portion out of the first plane. The second resonator portion is configured to operate in an out-of-plane flexural mode that displaces at least part of the second resonator portion out of the second plane and out-of-phase relative to the first resonator portion.

16 Claims, 6 Drawing Sheets

TIME A

TIME B

MICRO-MECHANICAL RESONATOR HAVING OUT-OF-PHASE AND OUT-OF-PLANE FLEXURAL MODE RESONATOR PORTIONS

BACKGROUND

Many electronic devices rely on a timing signal (e.g., a clock signal) for operations. The timing signal is generated based on a resonating component and related oscillator circuitry. Multipliers or dividers may be used to increase or decrease the frequency of the timing signal. For example, quartz crystal tuned oscillators (XOs) have good relative frequency accuracy, low frequency drift (or shift) as a function of temperature, and low noise. However, while the density of electronics has grown exponentially following Moore's law, the area and volume occupied by quartz crystals has not scaled accordingly. To address the scaling issue of XOs, efforts have been directed toward replacing XOs with oscillators based on micro-mechanical resonators. The micro-mechanical resonators may be a type of micro-electromechanical system (MEMS). There are different options to trigger acoustic or mechanical resonance in a MEMS. One type of micro-acoustic resonator involves a suspended or anchored piezoelectric circuit. A bulk acoustic wave (BAW) resonator is an example of a micro-mechanical resonator that includes a suspended or anchored piezoelectric portion, which generates micro-acoustic waves and a control circuit. When a control circuit applies one or more control signals to the terminals of the suspended or anchored piezoelectric resonator, acoustic excitation in one or more directions results. The acoustic excitation from the suspended piezoelectric resonator is used by the oscillator circuitry to generate the timing signal.

The operating frequency of a BAW resonator is a function of the thickness of each related composite layer. Some BAW resonators operate in the GHz range. In such case, multiple divider stages are used to divide the resulting frequency down to an output frequency in the tens of MHz or kHz range for timing applications. The divider stages add cost and increase power consumption. One option to lower the resonant frequency of a BAW resonator involves increasing the thickness of the related composite layers. However, achieving a BAW resonator having an operating frequency in the low MHz range would be impractical to manufacture (requiring a 1000× film thickness). The thickness mode nature of BAW resonators also prevents multiple frequency operation using one fabrication process.

Some micro-mechanical resonators use capacitive transduction to achieve resonant frequencies in the tens of MHz or lower. FIG. 1 is a perspective view illustrating a micro-mechanical resonator 100 in accordance with a conventional approach. In FIG. 1, the micro-mechanical resonator 100 includes pairs of arms 102 configured to resonate by moving towards each other (shown using arrows 108) or by moving away from each other (shown using arrow 106) based on a control signal. With the micro-mechanical resonator 100, the paired arms 102 resonate back and forth in the same plane.

FIG. 2 is a perspective view illustrating a micro-mechanical resonator 200 in accordance with another conventional approach. In FIG. 2, the micro-mechanical resonator 200 includes rings 202 configured to resonate by increasing in diameter (the increased ring size shown using arrows 204) or decreasing in diameter (the decreased ring size shown using arrows 206). With the micro-mechanical resonator 200, each of the rings 202 resonates inwards and outwards in the same plane. Capacitive MEMS resonators, such as the micro-mechanical resonators 100 and 200 of FIGS. 1 and 2, require nanometer scale gaps, making fabrication more challenging. Additionally, their lower electromechanical coupling (compared to a piezoelectric MEMS) results in more loss, higher motional resistance, and more power consumption to sustain oscillation.

SUMMARY

In an example embodiment, a micro-mechanical resonator die comprises: micro-mechanical resonator die layers; a cavity formed in at least one of the micro-mechanical resonator die layers; and a micro-mechanical resonator suspended in the cavity. The micro-mechanical resonator includes: a base; a first resonator portion extending from the base along a first plane; and a second resonator portion extending from the base along a second plane. The first resonator portion is configured to operate in an out-of-plane flexural mode that displaces at least part of the first resonator portion out of the first plane. The second resonator portion is configured to operate in an out-of-plane flexural mode that displaces at least part of the second resonator portion out of the second plane and out-of-phase relative to the first resonator portion.

In another example embodiment, a micro-mechanical resonator comprises: a base; a first resonator portion extending from the base along a first plane; and a second resonator portion extending from the base along a second plane. The first resonator portion is configured to operate in an out-of-plane flexural mode that displaces at least part of the first resonator portion out of the first plane. The second resonator portion is configured to operate in an out-of-plane flexural mode that displaces at least part of the second resonator portion out of the second plane and out-of-phase relative to the first resonator portion.

In yet another example embodiment, a method of manufacturing a micro-mechanical resonator die having a micro-mechanical resonator is described. The method comprises: forming a base of the micro-mechanical resonator; forming a first resonator portion extending from the base along a first plane, the first resonator portion configured to operate in an out-of-plane flexural mode that displaces at least part of the first resonator portion out of the first plane; and forming a second resonator portion extending from the base along a second plane, the second resonator portion configured to operate in an out-of-plane flexural mode that displaces at least part of the second resonator portion out of the second plane and out-of-phase relative to the first resonator portion.

DETAILED DESCRIPTION

Figure 1:
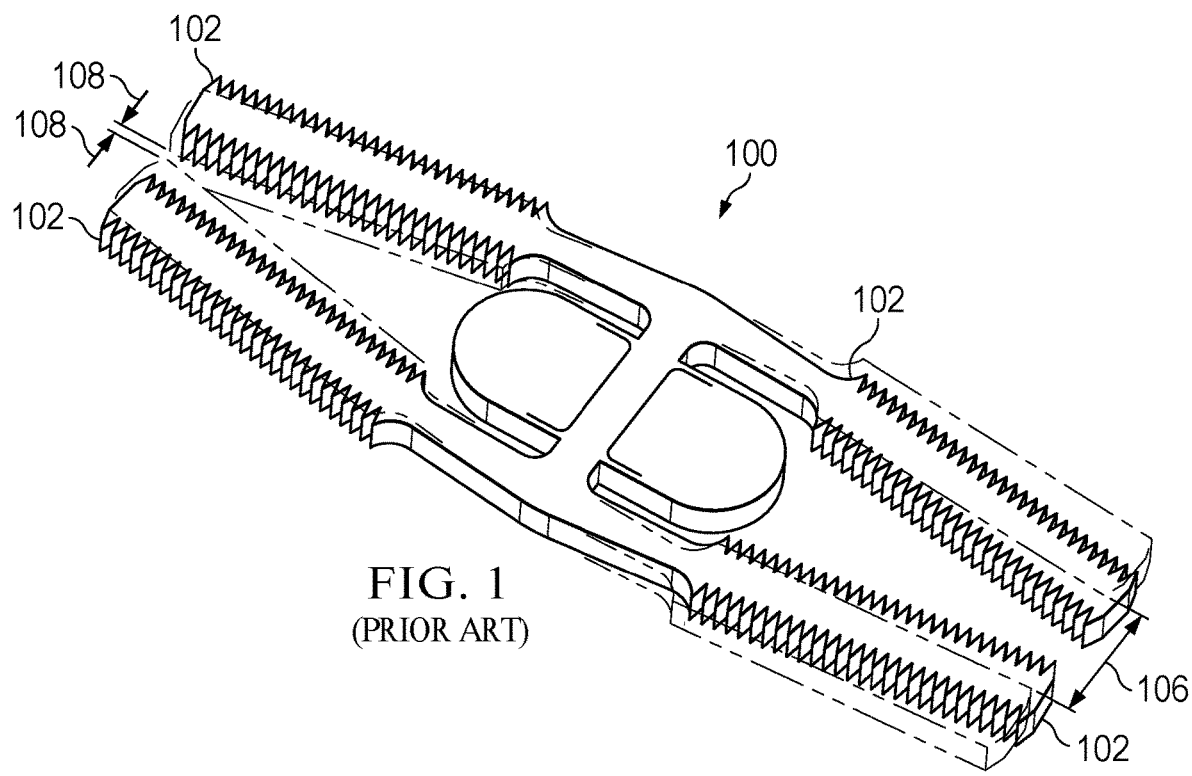
FIG. 1 is a perspective view illustrating a micro-mechanical resonator in accordance with a conventional approach.
Figure 2:
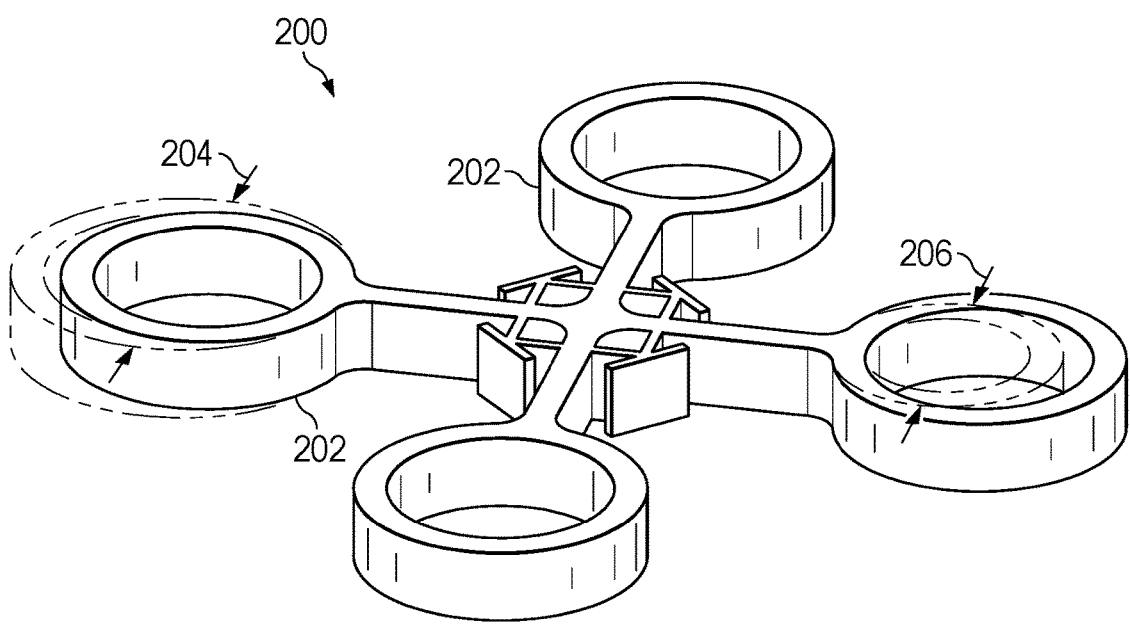
FIG. 2 is a perspective view illustrating a micro-mechanical resonator in accordance with another conventional approach.

The same reference number is used in the drawings for the same or similar (either by function and/or structure) features. Described herein are micro-mechanical resonators based on out-of-phase and out-of-plane flexural mode operations. In some example embodiments, a micro-mechanical resonator includes: a base; a first resonator portion extending from the base along a first plane; and a second resonator portion extending from the base along a second plane. The first resonator portion is configured to operate in an out-of-plane flexural mode that displaces at least part of the first resonator portion out of the first plane. The second resonator portion is configured to operate in an out-of-plane flexural mode that displaces at least part of the second resonator portion out of the second plane and out-of-phase relative to the first resonator portion. Without limitation, the first and second planes may be the same plane (sometimes referred to herein as overlapping planes). In such case, the first resonator portion may be an inner resonator portion relative to the second resonator portion. Optionally, a micro-mechanical resonator may include additional bases and related resonator portions. Without limitation, a micro-mechanical resonator may include balanced and symmetrical bases and resonator portions.

In different example embodiments, micro-mechanical resonator design options (e.g., the number of resonator portions, the mass/stiffness ratio and related resonant frequency of each resonator portion, etc.) may vary. With the described micro-mechanical resonators, a resonant frequency below a few MHz (e.g., 10 MHz) is possible (with some variation due to size and thickness options), which reduces the number of divider stages needed to provide a target oscillator output frequency (e.g., in tens of MHz or kHz range) for timing applications. The reduction of such divider stages reduces cost and power consumption for an oscillator circuit. An example oscillator circuit may include the micro-mechanical resonator, control circuitry for the micro-mechanical resonator, oscillator circuitry, and any divider stages. The oscillator circuit may be a stand-alone integrated circuit (IC), or may be included as part of a larger IC that uses the output frequency of the oscillator circuit or related timing signals. Without limitation, a micro-mechanical resonator may be a micro-acoustic resonator based on an electrostatic (capacitive) resonation design, a piezoelectric resonation design, and/or another resonation design. Other micro-mechanical resonator options are possible. Example materials of a micro-mechanical resonator may vary in position or size (resulting in resonation) as a function of voltage, current, temperature, magnetic field, electric field, and/or other controllable parameters.

Figure 3A:
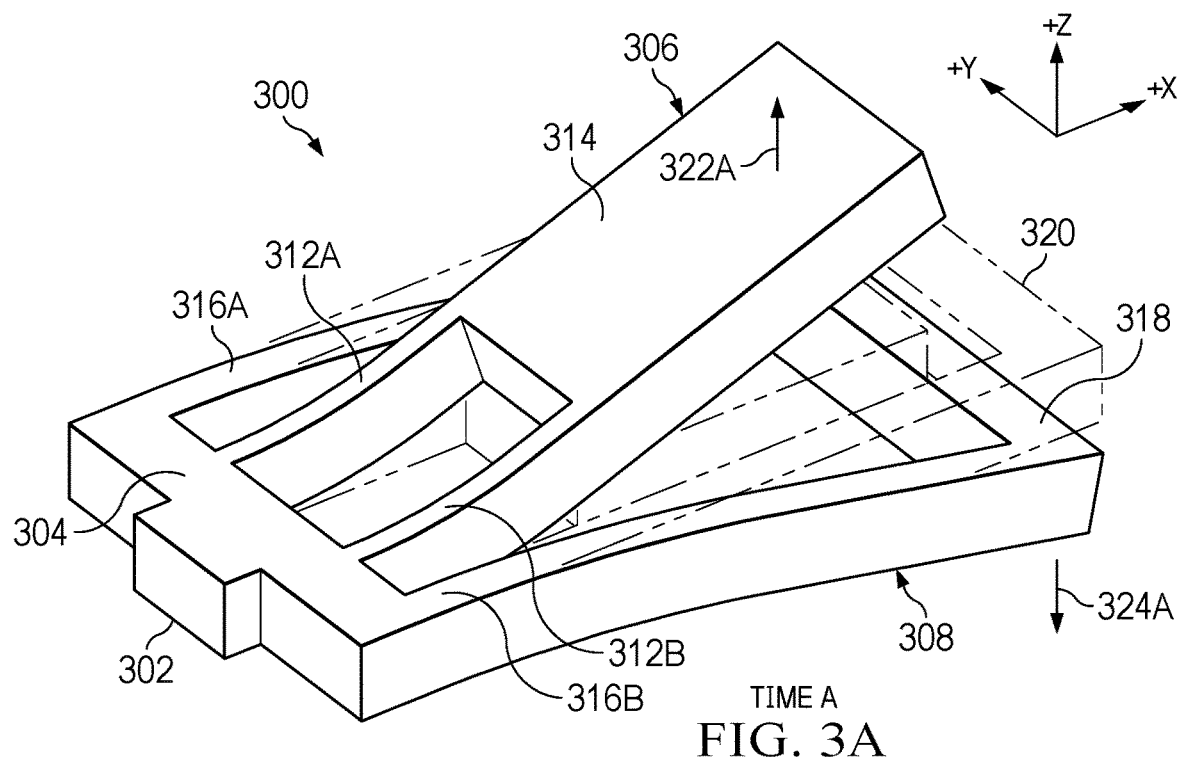
FIG. 3A is a perspective view illustrating a micro-mechanical resonator having a first out-of-plane position at time A in accordance with an example embodiment.

FIG. 3A is a perspective view illustrating a micro-mechanical resonator 300 having a first out-of-plane position at time A in accordance with an example embodiment. In the example of FIG. 3A, the micro-mechanical resonator 300 includes: a base 304; a first resonator portion 306 extending from the base 304; and a second resonator portion 308 extending from the base 304. The base 304 is coupled to an anchor 302, where the anchor is configured to couple the micro-mechanical resonator 300 to an ambient layer (e.g., of a silicon substrate) and suspends the micro-mechanical resonator 300 (e.g., in a cavity) such that related resonator portions of the micro-mechanical resonator 300 are able to resonate freely. In some example embodiments, only part of the anchor 302 is shown in FIG. 3A.

In the example of FIG. 3A, the first resonator portion 306 includes a mass 314 coupled to the base 304 using a first beam 312A and a second beam 312B. In some example embodiments, the first beam 312A and the second beam 312B of the first resonator portion 306 may be referred to as inner beams due to their respective inner positions relative to the position of the second resonator portion 308. Also, the mass 314 of the first resonator portion 306 may be referred to as an inner mass due to its inner position relative to the position of the second resonator portion 308.

As shown, the second resonator portion 308 includes a mass 318 coupled to the base 304 using a first beam 316A and a second beam 316B. In some example embodiments, the first beam 316A and the second beam 316B of the second resonator portion 308 may be referred to as outer beams due to their respective outer positions relative to the position of the first resonator portion 306. Also, the mass 318 of the second resonator portion 308 may be referred to as an outer mass due to its outer position relative to the position of the first resonator portion 306.

Without limitation, the design of the first resonator portion 306 and the second resonator portion 308 in example of FIG. 3A provides a compact design, which may help reduce overall cost. In other example embodiments, the dimensions of the base 304, the number and/or dimensions of inner beams, the number and/or dimensions of outer beams, the spacing between inner beams and/or outer beams, the dimensions/weight/stiffness of the masses 314 and 316, and/or other design parameters of the micro-mechanical resonator 300 may vary. Regardless of the particular design, a micro-mechanical resonator, such as the micro-mechanical resonator 300, is configured to support out-of-phase and out-of-plane flexural mode operations.

In a default position 320, the first resonator portion 306 and the second resonator portion 308 are both oriented along a first plane (the XY plane in FIG. 3A). In response to out-of-plane flexural mode operations of the micro-mechanical resonator 300 at time A, the first resonator portion 306 is displaced out-of-plane in the +Z direction 322A relative to the default position 320. Meanwhile, in response to out-of-plane flexural mode operations of the micro-mechanical resonator 300 at time A, the second resonator portion 308 is displaced out-of-plane in the −Z direction 324A relative to the default position 320. During out-of-plane flexural mode operations of the micro-mechanical resonator 300, the first resonator portion 306 and the second resonator portion 308 are out-of-phase (e.g., by 180 degrees). At time A, the out-of-phase operations result in the first resonator portion 306 having a maximum displacement in the +Z direction 322A relative to the default position 320, while the second resonator portion 308 has a maximum displacement in the −Z direction 322A relative to the default position 320. At other times, the displacement of the first resonator portion 306 and the second resonator portion 308 relative to the default position 320 varies.

Figure 3B:
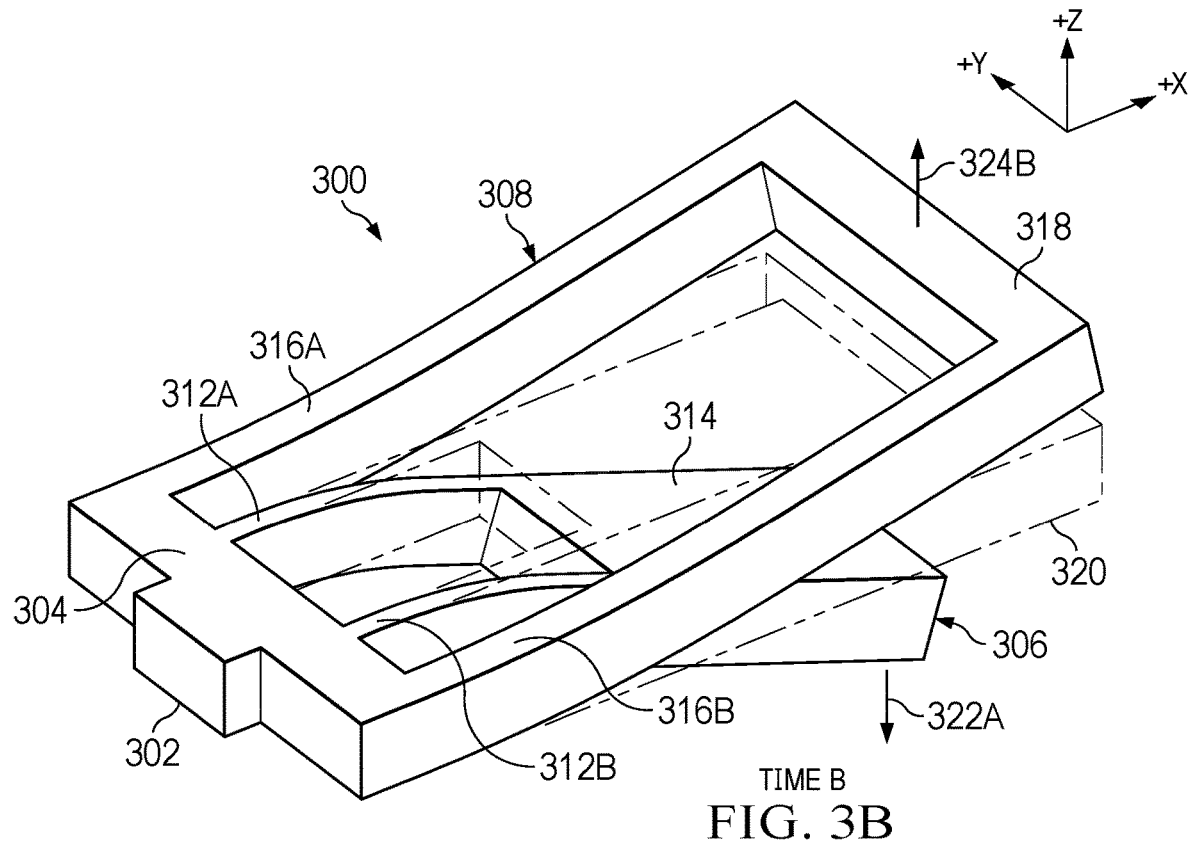
FIG. 3B is a perspective view illustrating the micro-mechanical resonator of FIG. 3A having a second out-of-plane position at time B (offset from time A) in accordance with an example embodiment.

FIG. 3B is a perspective view illustrating the micro-mechanical resonator 300 having a second out-of-plane position at time B (offset from time A) in accordance with an example embodiment. In response to out-of-plane flexural mode operations of the micro-mechanical resonator 300 at time B, the first resonator portion 306 is displaced out-of-plane in the −Z direction 322B relative to the default position 320. Meanwhile, in response to out-of-plane flexural mode operations of the micro-mechanical resonator 300 at time B, the second resonator portion 308 is displaced out-of-plane in the +Z direction 324B relative to the default position 320. During out-of-plane flexural mode operations of the micro-mechanical resonator 300, the first resonator portion 306 and the second resonator portion 308 are out-of-phase (e.g., by 180 degrees). At time B, the out-of-phase operations result in the first resonator portion 306 having a maximum displacement in the −Z direction 322B relative to the default position 320, while the second resonator portion 308 has a maximum displacement in the +Z direction 324B relative to the default position 320. At other times, the displacement of the first resonator portion 306 and the second resonator portion 308 relative to the default position 320 varies.

Figure 4:
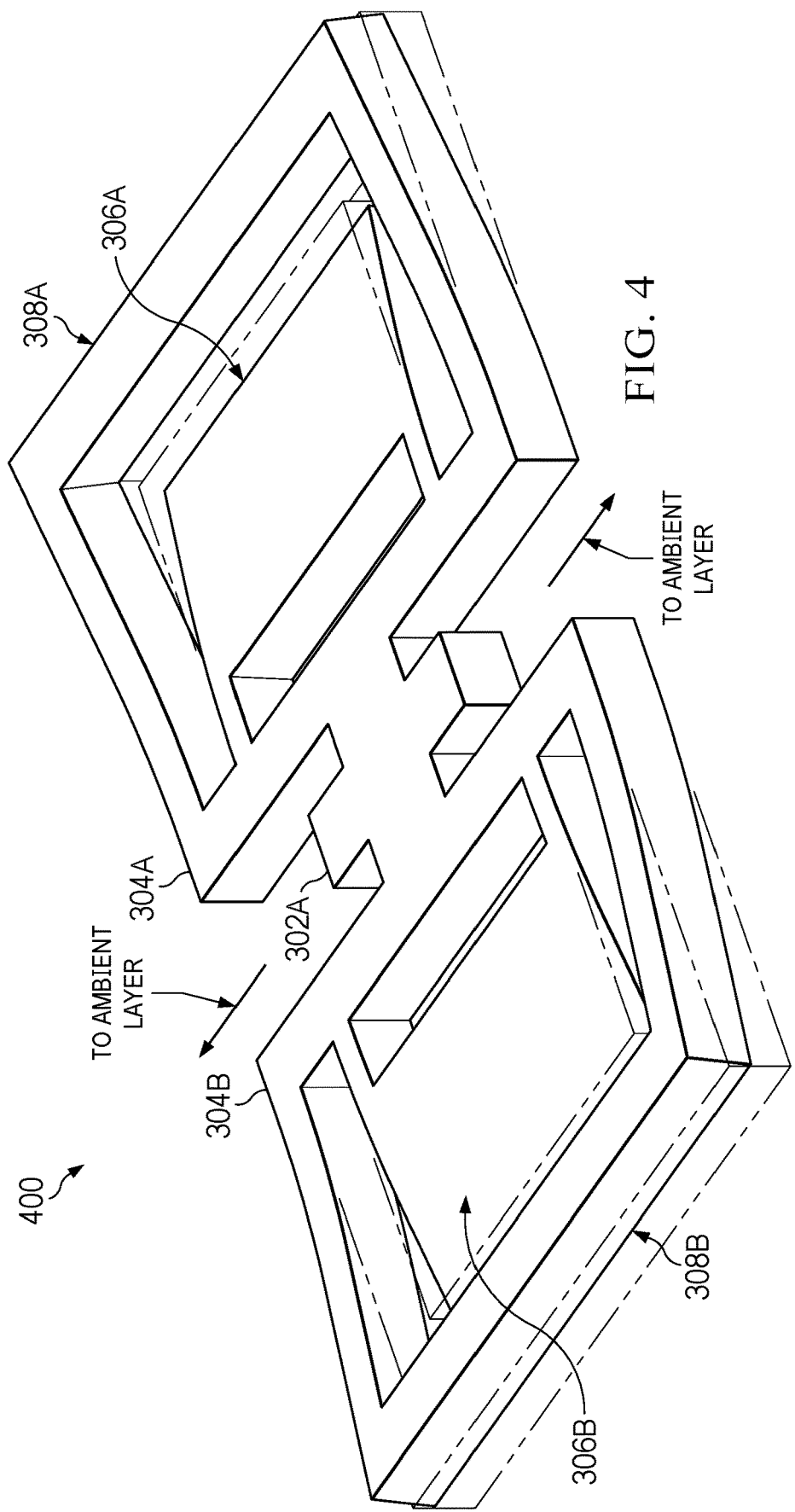
FIG. 4 is a perspective view illustrating a micro-mechanical resonator in accordance with another example embodiment.

FIG. 4 is a perspective view illustrating a micro-mechanical resonator 400 in accordance with another example embodiment. As shown, the micro-mechanical resonator 400 includes a first resonator portion 306A and a second resonator portion 308A extending from a first base 304A coupled to an anchor 302A (an example of the anchor 302 in FIGS. 3A and 3B). The micro-mechanical resonator 400 also includes a third resonator portion 306B and a fourth resonator portion 308B extending from a second base 304B coupled to the anchor 302A. As shown, the second base 304B is coupled to the opposite side of the anchor 302 relative to the first base 304B. Although not shown explicitly, the anchor 302A is adapted to be coupled on one or more sides to the substrate layer (e.g., one or more layers of a silicon substrate), such that the micro-mechanical resonator 400 is suspended (e.g., in a cavity) and related resonator portions of the micro-mechanical resonator 400 are able to resonate freely.

In FIG. 4, the dimensions illustrated for the first resonator portion 306A and the second resonator portion 308A of the micro-mechanical resonator 400 are different than the dimensions illustrated for the first resonator portion 306 and the second resonator portion 308 of the micro-mechanical resonator 300 of FIGS. 3A and 3B (e.g., the related beams and masses have a different layout). Regardless of the particular layout for the first resonator portion 306A and the second resonator portion 308A of the micro-mechanical resonator 400, the out-of-phase and out-of-plane flexural mode operations of the micro-mechanical resonator 400 will be similar to the out-of-phase and out-of-plane flexural mode operations described for the micro-mechanical resonator 300 of FIGS. 3A and 3B. Some variation in the resonant frequency can be expected for different resonator portion layouts, and such layouts may be designed and/or tuned to achieve a desired resonant frequency.

In the example of FIG. 4, the third resonator portion 306B is a mirrored version of the first resonator portion 306A. Also, the fourth resonator portion 308B is a mirrored version of the second resonator portion 308A. During out-of-phase and out-of-plane flexural mode operations of the micro-mechanical resonator 400, the first resonator portion 306A and the third resonator portion 306B will be in-phase with each other while out-of-phase with the second resonator portion 308A and the fourth resonator portion 308B. Likewise, the second resonator portion 308A and the fourth resonator portion 308B will be in-phase with each other while out-of-phase with the first resonator portion 306A and the third resonator portion 306B. Without limitation, the micro-mechanical resonator 400 may be referred to as having a "butterfly" design, where there are two sets of wings for the micro-mechanical resonator 400. Using the butterfly terminology, each set of wings (e.g., the first resonator portion 306A and the third resonator portions 306B is an inner set of wings, and the second resonator portion 308A and the fourth resonator portions 306B is an outer set of wings) is configured to operate together while out-of-phase with the other set of wings.

In some example embodiments, a micro-mechanical resonator (e.g., the micro-mechanical resonator 300 of FIGS. 3A and 3B) includes: a base (e.g., the base 304); a first resonator portion (e.g., the first resonator portion 306 of FIGS. 3A and 3B) extending from the base along a first plane (e.g., the XY plane related to the default position 320 of FIGS. 3A and 3B); and second resonator portion (e.g., the second resonator portion 308 in FIGS. 3A and 3B) extending from the base along a second plane (e.g., the XY plane related to the default position 320 of FIGS. 3A and 3B). The first resonator portion is configured to operate in an out-of-plane flexural mode that displaces at least part of the first resonator portion out of the first plane. The second resonator portion is configured to operate in an out-of-plane flexural mode that displaces at least part of the second resonator portion out of the second plane and out-of-phase relative to the first resonator portion.

In some example embodiments, the first resonator portion includes an inner beam (e.g., the first beam 312A or the second beam 312B of FIGS. 3A and 3B) and an inner mass (e.g., the mass 314 in FIGS. 3A and 3B) relative to the second resonator portion. The inner beam is coupled between the base and the inner mass. In some example embodiments, the second resonator portion includes outer beams (e.g., the first beam 316A and the second beam 316B of FIGS. 3A and 3B) and an outer mass (e.g., the mass 318 in FIGS. 3A and 3B) relative to the first resonator portion. The outer beams are coupled between the base and the outer mass.

In some example embodiments, the base is a first base (e.g., the first base 304A in FIG. 4), and the micro-mechanical resonator includes: a second base (e.g., the second base 304B in FIG. 4); a third resonator portion (e.g., the third resonator portion 306B in FIG. 4) extending from the second base along a third plane; and a fourth resonator portion (e.g., the fourth resonator portion 308B of FIG. 4) extending from the second base along a fourth plane. The third resonator portion is configured to operate in an out-of-plane flexural mode that displaces at least part of the third resonator portion out of the third plane. The fourth resonator portion is configured to operate in an out-of-plane flexural mode that displaces at least part of the fourth resonator portion out of the fourth plane and out-of-phase relative to the third resonator portion.

In some example embodiments, the first plane, the second plane, the third plane, and the fourth plane are the same or overlap (i.e., the first resonator portion 306A, the second resonator portion 308A, the third resonator portion 306B, and the fourth resonator portion 308B are oriented in the same XY plane). In some example embodiments, the first resonator portion is an inner resonator portion relative to the second resonator portion. In some example embodiments, the third resonator portion is an inner resonator portion relative to the fourth resonator portion. In some example embodiments, the first resonator portion and the third resonator portion are configured to operate in phase with each other. Also, the second resonator portion and the fourth resonator portion are configured to operate in phase with each other and out-of-phase with the first resonator portion and the third resonator portion.

In some example embodiments, the second base and the first base are coupled to respective opposite sides of an anchor related to the micro-mechanical resonator. In some example embodiments, the inner resonator portion and the outer resonator portion are configured to operate at a resonant frequency below a few MHz (e.g., 10 MHz).

Figure 5:
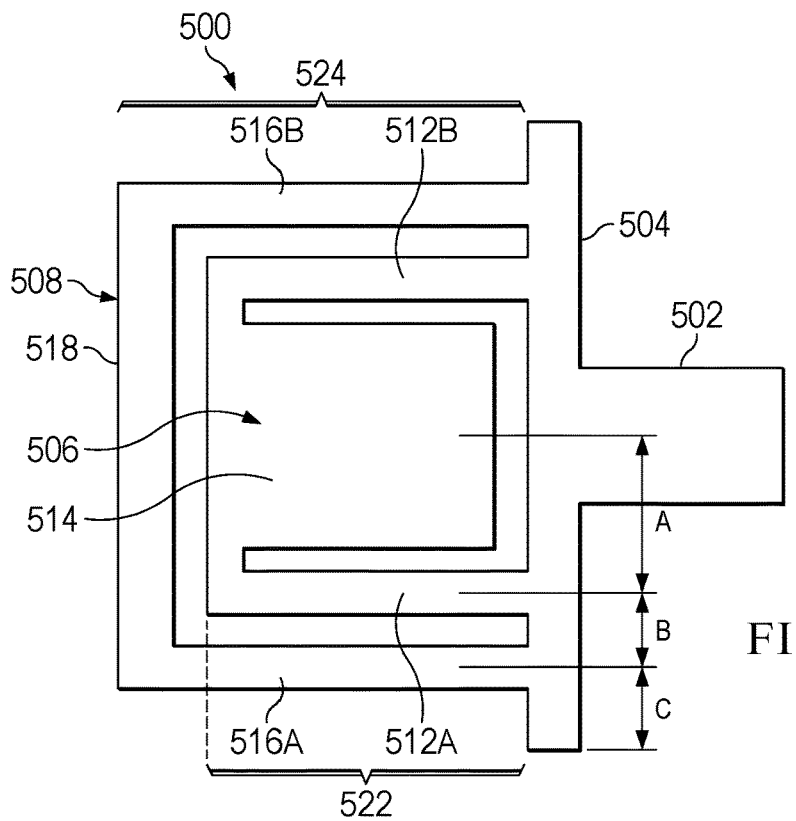
FIG. 5 is a top view illustrating a micro-mechanical resonator and related design parameters in accordance with an example embodiment.

FIG. 5 is a top view illustrating a micro-mechanical resonator 500 and related design parameters in accordance with an example embodiment. The micro-mechanical resonator 500 includes a base 504 (an example of the base 304 in FIGS. 3A and 3B, the first base 304A in FIG. 4, or the second base 304B in FIG. 4), and a first resonator portion 506 (an example of the first resonator portion 306 in FIGS. 3A and 3B, the first resonator portion 306A in FIG. 4, or the third resonator portion 306B in FIG. 4). The micro-mechanical resonator 500 also includes a second resonator portion 508 (an example of the second resonator portion 308 in FIGS. 3A and 3B, the second resonator portion 308A in FIG. 4, or the fourth resonator portion 308B in FIG. 4). As shown, the base 504 is coupled to an anchor 502 (an example of the anchor 302 in FIGS. 3A and 3B, or the anchor 302A in FIG. 4). In some example embodiments, only part of the anchor 502 is shown in FIG. 5.

In different example embodiments, the design parameters of the first resonator portion 506 and/or the second resonator portion 508 may vary. Example design parameters of the first resonator portion 506 include the length of the beams 512A and 512B, the cross-sectional area of the beams 512A and 512B, the shape of the beams 512A and 512B, where each of the beams 512A and 512B couple to the mass 514, the dimensions of the mass 514, the mass/stiffness ratio of the beams 512A and 512B, the mass/stiffness ratio of the mass 514 and/or other design parameter options. Example design parameters of the second resonator portion 508 include the length 524 of the beams 516A and 516B, the cross-sectional area of the beams 516A and 516B, the shape of the beams 516A and 516B, where the beams 516A and 516B couple to the mass 518, the dimensions of the mass 518, the mass/stiffness ratio of the beams 516A and 516B, the mass/stiffness ratio of the mass 518 and/or other design parameter options. As shown in FIG. 5, one design variation involves coupling the beams 512A and 512B to the top of the mass 514 rather than the bottom of the mass 514, which increases the length 522 of the beams 512A and 512B (to adjust the mass/stiffness ratio of the first resonator portion 506). Adjustments to design parameters of the first resonator portion 506 and/or the second resonator portion 508 may be performed based on a target layout and/or may be performed after testing to tune the resonant frequency, the out-of-plane displacement, and/or the out-of-phase operations of the micro-mechanical resonator 500. As desired, additional material (stiff or flexible) could be added to a given resonator portion. Without limitation, the mass 514 may have a rectangle or circle shape.

In the example of FIG. 5, other design parameter options are identified as options A, B, and C. Design parameter option A relates to the distance between each of the base coupling points of the beams 512A and 512B of the first resonator portion 506 relative to a center of the base 504 or anchor 502. Design parameter option B relates to the distance between the base coupling point of a respective inner beam (e.g., either the beam 512A or the beam 512B) relative to the base coupling point of an adjacent outer beam (e.g., either the beam 516A or the beam 516B). Design parameter option C relates to the distance between the base coupling point of an outer beam (e.g., either of the beam 516A or the beams 516B), and a nearest end of the base 504. Adjustments to design parameter options A, B, and/or C may be performed based on a target layout and/or may be performed to tune the resonant frequency, the out-of-plane displacement, and/or the out-of-phase operations of the micro-mechanical resonator 500.

Figure 6:
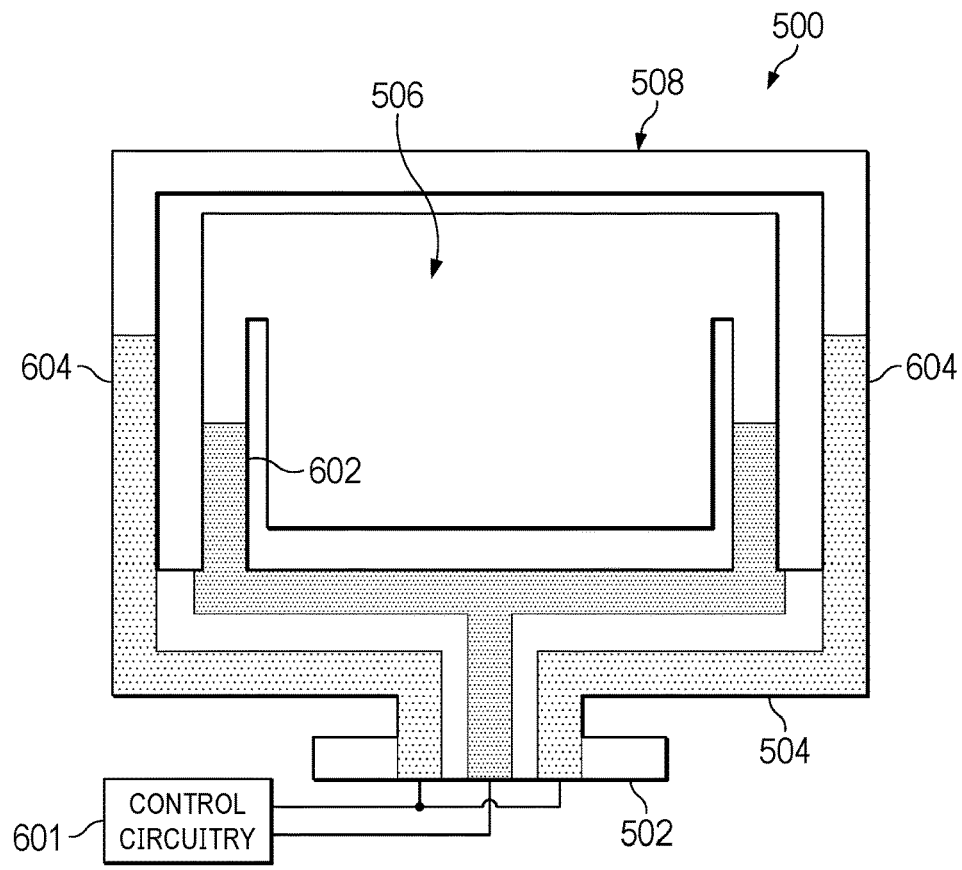
FIG. 6 is a top view illustrating a micro-mechanical resonator and excitation scheme in accordance with an example embodiment.

FIG. 6 is a top view illustrating the micro-mechanical resonator 500 of FIG. 5 and a related excitation scheme in accordance with an example embodiment. In FIG. 6, a first metal electrode layout 602 is represented along the base 504 and the inner beams of the first resonator portion 506. Also, a second metal electrode layout 604 is represented along the base 504 and the outer beams of the second resonator portion 508. In operation, control circuitry 601 coupled to the first metal electrode layout 602 and the second metal electrode layout 604 is configured to excite the related piezoelectric material to support out-of-phase and out-of-plane flexural mode operations of the micro-mechanical resonator 500 as described herein. In different example embodiments, the design parameters (thickness and layout relative to each resonator) of the first metal electrode layout 602 and/or the second metal electrode layout 604 may vary. Also, the control signals from the control circuitry 601 may vary. Such variance may result in the changes to the resonant frequency of the micro-mechanical resonator 500

Figure 7:
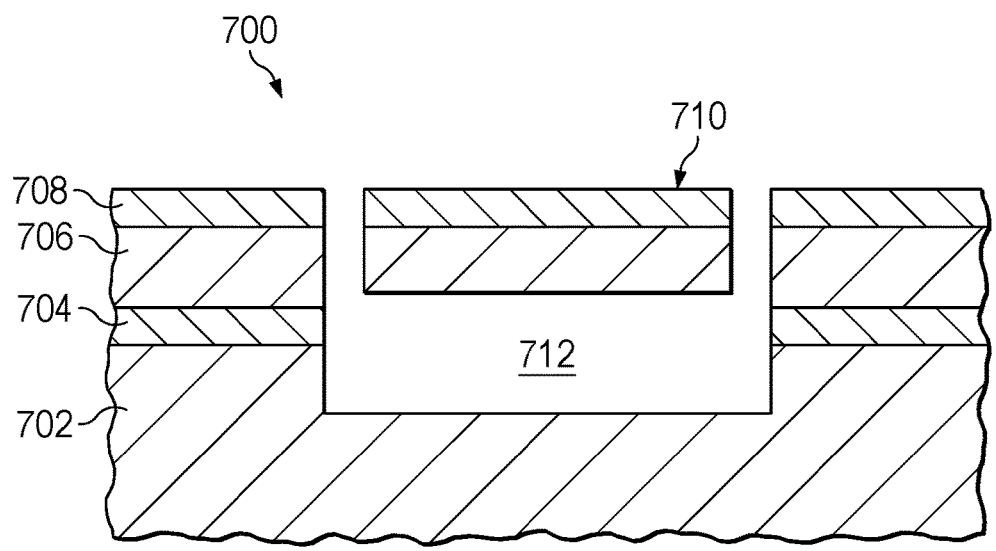
FIG. 7 is a cross-sectional view illustrating layers of micro-mechanical resonator die having a micro-mechanical resonator in accordance with an example embodiment.

FIG. 7 is a cross-sectional view illustrating layers of a micro-mechanical resonator die 700 having a micro-mechanical resonator 710 (an example of the micro-mechanical resonator 300 of FIGS. 3A and 3B, the micro-mechanical resonator 400 of FIG. 4, or the micro-mechanical resonator 500 of FIGS. 5 and 6) in accordance with an example embodiment. In the example of FIG. 7, the micro-mechanical resonator die 700 is a micro-machined silicon-on-insulation (SOI) wafer, which includes a first layer 702, a second layer 704, a third layer 706, and a fourth layer 708. Without limitation, the first layer 702 may be a handle layer (e.g., a silicon layer), the second layer 704 may be a buried oxide layer, the third layer 704 may be a device layer (e.g., another silicon layer), and the fourth layer 708 may be a piezo layer (e.g., AlN between electrodes). In the cross-sectional view of FIG. 7, the micro-mechanical resonator 710 may be formed using the third layer 706 and the fourth layer 708. As shown, the micro-mechanical resonator 710 is suspended over a cavity 712. The cavity 712 may be formed, for example, by etching the second layer 704 and part of the first layer 702.

Figure 8:
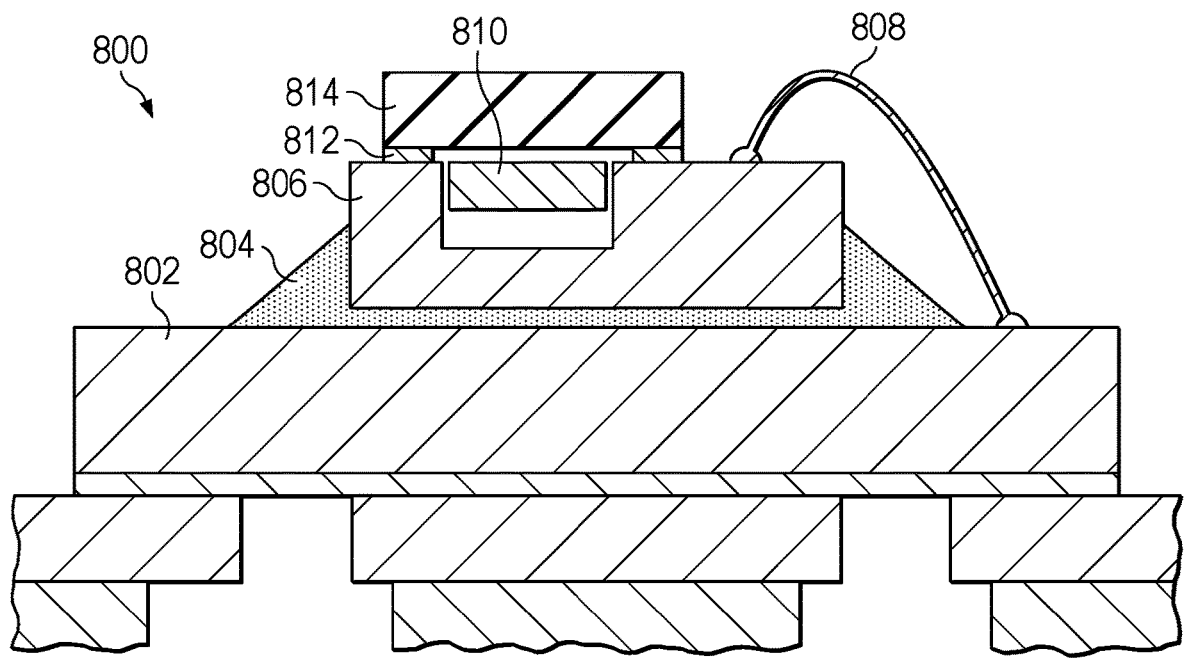
FIG. 8 is a cross-sectional view illustrating a multi-chip package arrangement having a micro-mechanical resonator in accordance with an example embodiment.

FIG. 8 is a cross-sectional view illustrating a multi-chip package arrangement 800 having a micro-mechanical resonator 810 (e.g., the micro-mechanical resonator 300 of FIGS. 3A and 3B, the micro-mechanical resonator 400 of FIG. 4, the micro-mechanical resonator 500 of FIGS. 5 and 6, the micro-mechanical resonator 710 of FIG. 7) in accordance with an example embodiment. In the example of FIG. 8, the micro-mechanical resonator 810 is part of a micro-mechanical resonator die 806 that is bonded to another semiconductor die 802 by adhesive 804. The semiconductor die 802 may include, for example, oscillator circuitry and/or other circuitry. In the example of FIG. 8, the micro-mechanical resonator 810 is covered by a cap 814 (e.g., a silicon cap), which may be bonded to the micro-mechanical resonator die 806 by adhesive 812. In other example embodiments, a micro-mechanical resonator may be part of a semiconductor die having oscillator circuitry and/or other circuitry.

In some example embodiments, a micro-mechanical resonator die (e.g., a stand-alone die, part of an IC, part of a multi-chip package arrangement, or part of a circuit having a combination of semiconductor die components and external components) includes: micro-mechanical resonator die layers (e.g., the micro-mechanical resonator die layers 702, 704, 706, and 708 of FIG. 7); a cavity (e.g., the cavity 712 of FIG. 7) formed in at least one of the micro-mechanical resonator die layers; and a micro-mechanical resonator (e.g., the micro-mechanical resonator 300 of FIGS. 3A and 3B, the micro-mechanical resonator 400 of FIG. 4, the micro-mechanical resonator 500 of FIGS. 5 and 6, the micro-mechanical resonator 710 of FIG. 7, or the micro-mechanical resonator 810 of FIG. 8) suspended in the cavity. The micro-mechanical resonator includes: a base (e.g., the base 304 of FIGS. 3A and 3B); a first resonator portion (e.g., the first resonator portion 306 of FIGS. 3A and 3B) extending from the base along a first plane; and a second resonator portion (e.g., the second resonator portion 308 of FIGS. 3A and 3B) extending from the base along a second plane. In different example embodiments, the first plane and the second plane may be the same plane or different planes. The first resonator portion is configured to operate in an out-of-plane flexural mode that displaces at least part of the first resonator portion out of the first plane. The second resonator portion is configured to operate in an out-of-plane flexural mode that displaces at least part of the second resonator portion out of the second plane and out-of-phase relative to the first resonator portion.

In some example embodiments, the first plane and the second plane overlap, the first resonator portion includes an inner beam (e.g., the first beam 312A or the second beam 312B of FIGS. 3A and 3B) and an inner mass (e.g., the mass 314 of FIGS. 3A and 3B) relative to the second resonator portion. The inner beam is coupled between the base and the inner mass. In some example embodiments, the first plane and the second plane overlap, the first resonator portion includes a first inner beam (e.g., the first beam 312A of FIGS. 3A and 3B), a second inner beam (e.g., the second beam 312B of FIGS. 3A and 3B) and an inner mass (e.g., the mass 314 of FIGS. 3A and 3B) relative to the second resonator portion. The first inner beam is coupled between the base and a first side of the inner mass. The second inner beam is coupled between the base and a second side of the inner mass opposite the first side.

In some example embodiments, the first plane and the second plane overlap, the second resonator portion includes outer beams (e.g., the first beam 316A and second beam 316B of FIGS. 3A and 3B) and an outer mass (e.g., the mass 318 of FIGS. 3A and 3B) relative to the first resonator portion. The outer beams are coupled between the base and the outer mass. In some example embodiments, the outer beams include a first outer beam (e.g., the first beam 316A of FIGS. 3A and 3B) and a second outer beam (e.g., the second beam 316B of FIGS. 3A and 3B). The first output beam is coupled between the base and a first side of the outer mass. The second outer beam is coupled between the base and a second side of the outer mass opposite the first side.

In some example embodiments, the base is a first base (e.g., the first base 304A of FIG. 4), and the micro-mechanical resonator includes: a second base (e.g., the second base 304B of FIG. 4); a third resonator portion (e.g., the third resonator portion 306B of FIG. 4) extending from the second base along a third plane; and a fourth resonator portion (e.g., the fourth resonator portion 308B of FIG. 4) extending from the second base along a fourth plane. The third resonator portion is configured to operate in an out-of-plane flexural mode that displaces at least part of the third resonator portion out of the third plane. The fourth resonator portion is configured to operate in an out-of-plane flexural mode that displaces at least part of the fourth resonator portion out of the fourth plane and out-of-phase relative to the third resonator portion.

In some example embodiments, the first plane, the second plane, the third plane, and the fourth plane are the same or overlap (e.g., the first resonator portion 306A, the second resonator portion 308A, the third resonator portion 306B, and the fourth resonator portion 308B are oriented in the same XY plane). In some example embodiments, the first resonator portion is an inner resonator portion relative to the second resonator portion. In some example embodiments, the third resonator portion is an inner resonator portion relative to the fourth resonator portion. In some example embodiments, the first resonator portion and the third resonator portion are configured to operate in phase with each other. The second resonator portion and the fourth resonator portion are configured to operate in phase with each other and out-of-phase with the first resonator portion and the third resonator portion.

In some example embodiments, the second base and the first base are coupled to respective opposite sides of an anchor related to the micro-mechanical resonator. In some example embodiments, the inner resonator portion and the outer resonator portion are configured to operate at a resonant frequency below a few MHz (e.g., 5 MHz).

Figure 9:
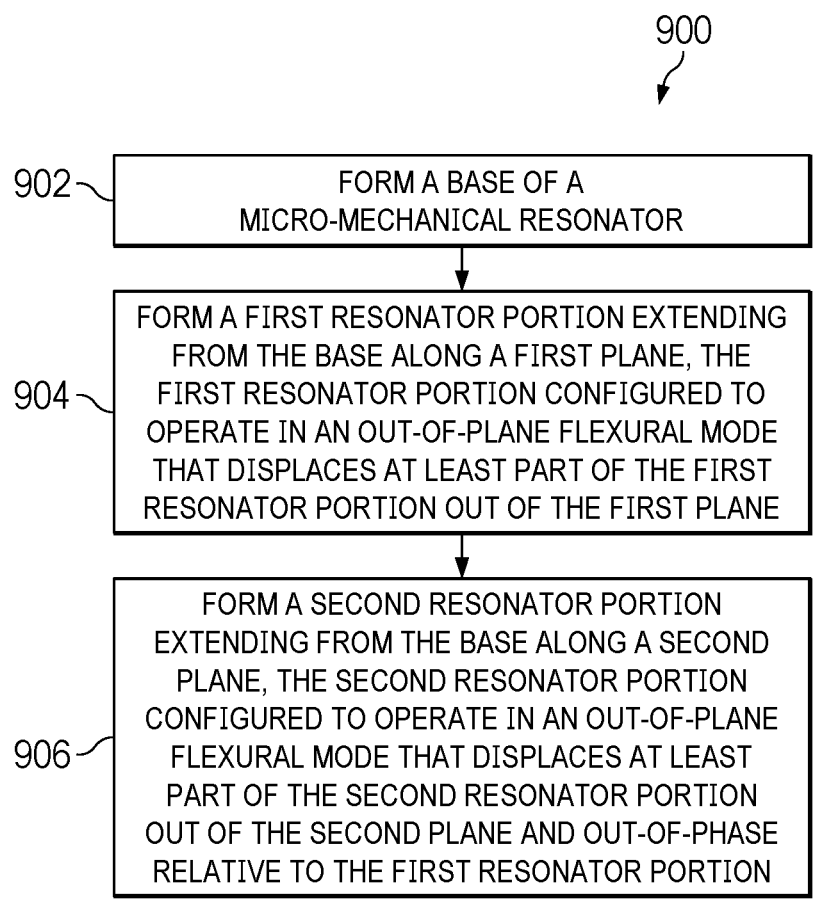
FIG. 9 is a flowchart illustrating a method of manufacturing a micro-mechanical resonator in accordance with an example embodiment.

FIG. 9 is a flowchart illustrating a method 900 of manufacturing a micro-mechanical resonator in accordance with an example embodiment. As shown, the method 900 includes forming a base (e.g., the base 304 in FIGS. 3A and 3B, the base 304A in FIG. 4, the base 504 in FIGS. 5 and 6) of the micro-mechanical resonator at block 902. At block 904, a first resonator portion (e.g., the first resonator portion 306 of FIGS. 3A and 3B, the first resonator portion 306A of FIG. 4, or the first resonator portion 506 of FIGS. 5 and 6) extending from the base along a first plane is formed. The first resonator portion is configured to operate in an out-of-plane flexural mode that displaces at least part of the first resonator portion out of the first plane. At block 906, a second resonator portion (e.g., the second resonator portion 308 of FIGS. 3A and 3B, the second resonator portion 308A of FIG. 4, or the second resonator portion 508 of FIGS. 5 and 6) extending from the base along a second plane is formed. The second resonator portion is configured to operate in an out-of-plane flexural mode that displaces at least part of the second resonator portion out of the second plane and out-of-phase relative to the first resonator portion.

In some example embodiments, forming the first resonator portion at block 904 includes forming at least one inner beam and an inner mass relative to the second resonator portion. The inner beams are coupled between the base and the inner mass. In some example embodiments, forming the second resonator at block 906 includes forming outer beams and an outer mass relative to the first resonator portion. The outer beams are coupled between the base and the outer mass.

In some example embodiments, the base is a first base (e.g., the first base 304A in FIG. 4), and the method 900 includes: forming a second base (e.g., the second base 304B in FIG. 4); forming a third resonator portion (e.g., the third resonator portion 306B in FIG. 4) extending from the second base along a third plane; and forming a fourth resonator portion (e.g., the fourth resonator portion 308B) extending from the second base along a fourth plane. The third resonator portion is configured to operate in an out-of-plane flexural mode that displaces at least part of the third resonator portion out of the third plane. The fourth resonator portion is configured to operate in an out-of-plane flexural mode that displaces at least part of the fourth resonator portion out of the fourth plane and out-of-phase relative to the third resonator portion. In some example embodiments, the method 900 includes: selecting a mass/stiffness ratio for the first resonator portion; and selecting dimensions and base coupling locations for beams of the first resonator portion and beams of the second resonator portion based on target out-of-phase operations for the first resonator portion and the second resonator portion.

In some example embodiments, a micro-mechanical resonator includes out-of-plane flexural mode resonators with multiple portions or "arms" operating out-of-phase. Example options include: an inner arm and an outer arm; each arm including a mass attached to two beams; both arms operating in an out-of-plane flexural mode; both arms designed to resonate at the same frequency; and the inner and outer arms moving out of phase relative to each other. Without limitation, the arms may be driven piezoelectrically (e.g., piezoelectric material on silicon).

Other micro-mechanical resonator options include: a symmetrical design (a "butterfly" design) for improved anchor balance; adjusting inner arm mass/stiffness ratio for frequency matching; and adjusting anchor/coupler lengths to account for lower resonant frequencies (e.g., anchor/coupler lengths may be adjusted up or down for a given micromechanical resonator based on its target or tested resonant frequency). In some example embodiments, a quarter wavelength ($\lambda/4$) size for anchors/couplers is avoided in favor of shorter anchor/coupler lengths to account for a lower resonant frequency. Additional micro-mechanical resonator options include adjusting the coupling points and/or length (e.g., design parameter options A, B, and/or C) for both arms to force anti-symmetric (out-of-phase) modes.

With the described micro-mechanical resonator, naturally low frequency operation (kHz to low MHz) suitable for a real-time clock (RTC) is possible. As another option, the micro-mechanical resonator may be designed or tuned to provide an output frequency in the tens of MHz. In either case, divider stages may be reduced (relative to some conventional approaches), which reduces cost and power consumption. Other advantages include: defining the resonant frequency at the layout level; supporting multiple resonant frequencies in one fabrication process; and the out-of-plane mode providing low motional resistance for piezo-on-Si structures.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An apparatus, comprising:
   a die including a cavity;
   an anchor coupled to the die;
   a first resonator coupled to a side of the anchor and suspended over the cavity, the first resonator operable to bend towards or away from a bottom of the cavity; and
   a second resonator coupled to the side of the anchor and suspended over the cavity, at least a part of the first resonator being laterally between the side of the anchor and a part of the second resonator, and the first resonator operable to bend in an opposite direction from the second resonator.

2. The apparatus of claim 1, wherein the first resonator includes a first mass portion, a first beam, and a second beam, the first and second beams coupled between the side of the anchor and the first mass portion; and
   wherein the second resonator includes a second mass portion, a third beam, and a fourth beam, the third and fourth beams coupled between the side of the anchor and the second mass portion, and at least one of the first beam, the second beam, or the first mass portion is laterally between the side of the anchor and the second mass portion.

3. The apparatus of claim 1, wherein:
   the side is a first side, the anchor has a second side opposing the first side; and
   the apparatus further comprises third and fourth resonators extending from the second side of the anchor over the cavity.

4. The apparatus of claim 3,
   wherein the first resonator includes a first beam, a second beam, and a first mass portion, the first and second beams coupled between the first side of the anchor and the first mass portion;
   wherein the second resonator includes a third beam, a fourth beam, and a second mass portion, the third and fourth beams coupled between the first side of the anchor and the second mass portion;
   wherein the third resonator includes a fifth beam, a sixth beam, and a third mass portion, the fifth and sixth beams coupled between the second side and the third mass portion, and the fifth and sixth beams operable to bend together towards or away from the bottom of the cavity; and
   wherein the fourth resonator includes a seventh beam, an eighth beam, and a fourth mass portion, the seventh and eighth beams coupled between the second side and the fourth mass portion, and the seventh and eighth beams operable to bend in an opposite direction from the fifth and sixth beams.

5. The apparatus of claim 4, wherein the fifth and sixth beams are operable to bend in a same direction as the first and second beams.

6. The apparatus of claim 2, further comprising:
a first electrode coupled to the first and second beams;
a second electrode coupled to the third beam; and
a control circuitry having out-of-phase outputs coupled to the first and second electrodes.

7. An apparatus, comprising:
a die including a cavity;
an anchor coupled to the die;
a first resonator coupled to the die and suspended over the cavity, the first resonator coupled to a side of the anchor, and the first resonator operable to bend towards or away from a bottom of the cavity; and
a second resonator coupled to the side of the anchor and suspended over the cavity, at least a part of the first resonator being laterally between the side of the anchor and a part of the first resonator, and the second resonator operable to bend towards or away from the bottom of the cavity.

8. The apparatus of claim 7, wherein the first resonator is operable to bend in an opposite direction from the second resonator.

9. The apparatus of claim 7, wherein:
the side is a first side, the anchor has a second side opposing the first side; and
the apparatus further comprises third and fourth resonators extending from the second side of the anchor over the cavity.

10. The apparatus of claim 9,
wherein the first resonator includes a first beam, a second beam, and a first mass portion, the first and second beams coupled between the first side of the anchor and the first mass portion;
wherein the second resonator includes a third beam, a fourth beam, and a second mass portion, the third and fourth beams coupled between the first side of the anchor and the second mass portion, at least one of the first beam, the second beam, or the first mass portion being laterally between the side of the anchor and the second mass portion;
wherein the third resonator includes a fifth beam, a sixth beam, and a third mass portion, the fifth and sixth beams coupled between the second side and the third mass portion, and the fifth and sixth beams operable to bend together towards or away from the bottom of the cavity; and
wherein the fourth resonator includes a seventh beam, an eighth beam, and a fourth mass portion, the seventh and eighth beams coupled between the second side and the fourth mass portion, and the seventh and eighth beams operable to bend in an opposite direction from the fifth and sixth beams.

11. The apparatus of claim 10, wherein the fifth and sixth beams are operable to bend in a same direction as the first and second beams.

12. The apparatus of claim 10, further comprising:
a first electrode coupled to the first and second beams;
a second electrode coupled to the third beam; and
a control circuitry having out-of-phase outputs coupled to the first and second electrodes.

13. An apparatus comprising:
a die having a cavity;
an anchor coupled to the die;
first, second, third, and fourth piezoelectric beams each coupled to a side of the anchor and suspended over the cavity;
a first mass portion suspended over the cavity and coupled between the first and second piezoelectric beams; and
a second mass portion suspended over the cavity and coupled to the third and fourth piezoelectric beams, the second mass portion, at least one of the first piezoelectric beam, the second piezoelectric beam, or the first mass portion being laterally between the side of the anchor and the second mass portion.

14. The apparatus of claim 13, wherein the third and fourth piezoelectric beams and the second mass portion surround at least part of a periphery of the first and second piezoelectric beams and the first mass portion.

15. The apparatus of claim 13, wherein the first and second piezoelectric beams and the first mass portion are part of a first resonator, and the third piezoelectric beam and the second mass portion are part of a second resonator.

16. The apparatus of claim 13, wherein the first and second piezoelectric beams are operable to bend in an opposite direction from the third piezoelectric beam.

* * * * *